Figure 1:
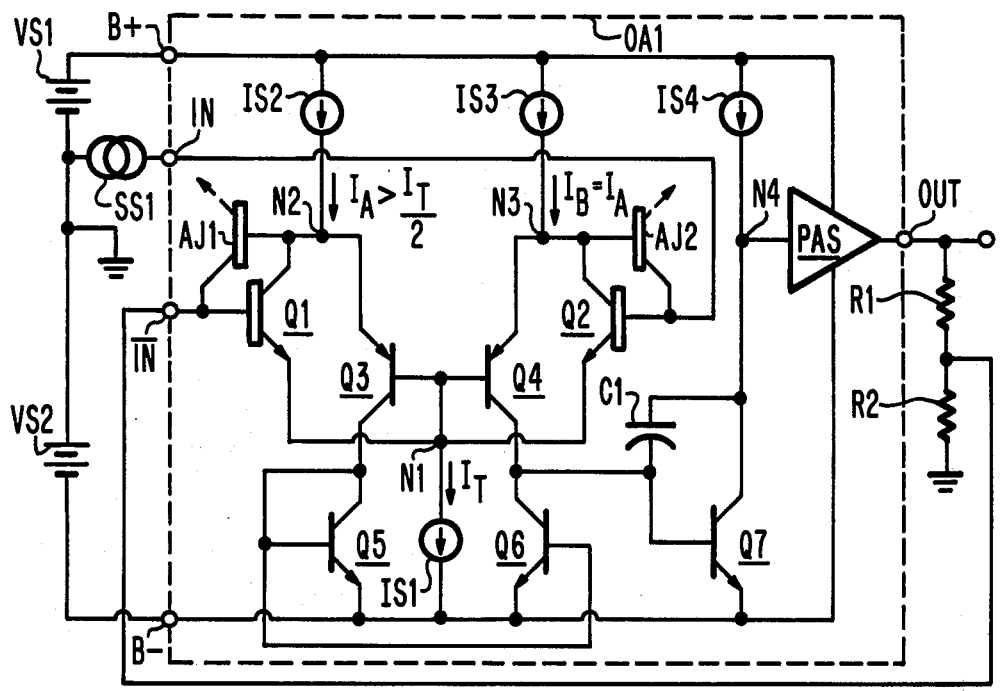

United States Patent [19]

Robe

[11] 4,151,482

[45] Apr. 24, 1979

[54] FOLDED-CASCODE AMPLIFIER STAGES

[75] Inventor: Thomas J. Robe, Bridgewater Township, Somerset County, N.J.

[73] Assignee: RCA Corporation, New York, N.Y.

[21] Appl. No.: 878,883

[22] Filed: Feb. 17, 1978

[51] Int. Cl.² ............................................. H03F 3/08
[52] U.S. Cl. .................................... 330/308; 307/308; 330/296; 330/311
[58] Field of Search ................ 307/308; 330/308, 311, 330/296

[56] References Cited

U.S. PATENT DOCUMENTS

| | | | |
|---|---|---|---|
| 3,409,839 | 11/1968 | Crowe | 307/308 X |
| 3,524,999 | 8/1970 | Fletcher et al. | 307/308 |
| 3,982,197 | 9/1976 | Schade, Jr. | 307/308 X |

Primary Examiner—Lawrence J. Dahl

Attorney, Agent, or Firm—H. Christoffersen; A. L. Limberg; E. P. Herrman

[57] ABSTRACT

A folded-cascode amplifier conventionally comprises an "input" transistor of a first conductivity type receiving input signals at its base electrode, an "output" transistor of a second conductivity type, complementary to the first, connected in common-base amplifier configuration with its base electrode connected to receive fixed bias potential, and a current source supplying the combined "input" transistor collector current and "output" transistor emitter current to an interconnection between the "input" transistor collector electrode and "output" transistor emitter electrode. In the folded-cascode amplifiers herein disclosed the base electrode of the "output" transistor has the input-signal-responsive emitter potential of the "input" transistor applied to it.

8 Claims, 4 Drawing Figures

FOLDED-CASCODE AMPLIFIER STAGES

The present invention relates to folded-cascode amplifiers.

R. S. Hughes in U.S. Pat. No. 3,473,134 issued Oct. 14, 1969, and entitled "Temperature Stable D.C. Inverter" describes the configuration herein generally referred to as a "folded-cascode amplifier." The collector electrode of a common-emitter amplifier "input" transistor of a first conductivity type and the base electrode of a common-base amplifier "output" transistor of a second conductivity type are interconnected to receive their respective quiescent collector and emitter currents from the same source and to form respectively the first and second portions of a cascoded amplifier arrangement. ("Input" and "output" are placed in quotation marks since the "input" and "output" transistors of the folded-cascode amplifier may not be the input and output transistors of the complete circuitry including the folded-cascode amplifier). In Hughes the emitter electrode of the "input" transistor and the base electrode of the "output" transistor are each referred in potential to fixed supply potentials. Differential amplifier connections of folded cascode stages in which the respective "input" transistors are in long-tailed pair connection with each other and in which the respective "output" transistors have like bias potentials are known from U.S. Pat. No. 3,979,689 issued to O. H. Schade, Jr. on Sept. 7, 1976, and entitled "Differential Amplifier Circuit."

The prior art configurations thus far described make no attempt to regulate the emitter-to-collector potential (or $V_{CE}$) of the "input" transistor. It is known, for example, from U.S. Pat. No. 3,614,645, issued Oct. 19, 1971, that regulation of the $V_{CE}$ of an amplifier input transistor to equal its emitter-to-base potential (or $V_{BE}$) permits the transistor to be of a "punch-through" or "super-beta" type having a super-thin base region and attendant high current gain. Also, it is known that such regulation essentially eliminates the leakage currents across the collector-base junction.

A. J. Leidich in U.S. Pat. No. 4,007,427 issued Feb. 8, 1977, and entitled "Cascaded Transistor Amplifier Stages" describes a differential amplifier comprising a pair of "input" transistors of a first conductivity type connected in long-tailed pair configuration, a pair of emitter-follower transistors of the first conductivity type having separate ones of the collector electrodes of the input transistors connected to their respective base electrodes, and a pair of "output" transistors of a second conductivity type, complementary to the first, connected emitter-to-emitter with respective ones of the emitter-follower transistors. The "output" transistors are operated as common-base amplifiers for signal, with the potential at the interconnection between the emitter electrodes of the "input" transistors being applied to the base electrodes of the "output" transistors, either directly or indirectly by potential offsetting means. In the circuits described by Leidich, the regulation of the $V_{CE}$'s of the "input" transistors to equal their $V_{BE}$'s is achieved using the well-defined offset potentials of the emitter-base junctions of the output transistors and of the emitter follower transistors together with either (a) suitable potential offsetting means inserted into the connection for applying potential from the interconnection of the "input" transistor emitter electrodes to the "output" transistor base electrodes or (b) suitable respective potential offsetting means inserted between, on one hand, the collector electrodes of the "input" transistors and, on the other hand, the base electrodes of the emitter-follower transistors. Also, both approaches may be simultaneously employed.

In a differential amplifier employing Leidich's teaching the use of the emitter-follower transistors prevents respective ones of the "input" and "output" transistors from being connected in folded-cascode connection insofar as receiving "input" transistor quiescent collector currents and "output" transistor quiescent emitter currents from common current sources. The emitter-follower transistors interfere with the establishment of relationships between the quiescent collector currents of the "input" transistors and the quiescent emitter currents of the "output" transistors by the simple mechanism of sharing current from common sources, so additional circuit elements are required to establish these relationships.

The present invention is embodied in circuitry having at least one folded-cascode amplifier element in which the input-signal-responsive emitter potential of the "input" transistor is applied either (a) directly to the base electrode of the "output" transistor or (b) indirectly by potential offsetting means, thereby to regulate the emitter-to-collector potential (or $V_{CE}$) of the "input" transistor.

In the drawing:

Each of FIGS. 1, 2, 3 and 4 is a schematic drawing, partially in block form, of an operational amplifier, the input stage of which embodies the present invention.

In FIG. 1 operational amplifier OA1 shown within dashed outline is of a form suitable for monolithic integration. OA1 has inverting and non-inverting input signal terminals, $\overline{\text{IN}}$ and IN, respectively; an output signal terminal OUT; and terminals B+ and B− for respective connection to relatively positive and relatively negative operating supplies VS1 and VS2, respectively. OA1 is shown connected as a voltage amplifier. Signal source SS1 supplies to terminal IN an input signal potential, referred to the ground potential at the interconnection between VS1 and VS2. A fraction of the output signal potential appearing at terminal OUT, as determined by the potential division in the divider network comprising serially connected resistors R1 and R2 is applied to terminal $\overline{\text{IN}}$ as a feedback signal. The terminals IN and $\overline{\text{IN}}$ each receive a differential-mode-voltage, respectively equal to the input signal potential and to a fraction—$R_2(R1+R2)$—of the output signal potential, each superimposed on a common-mode ground level voltage. As customary in such connections of an operational amplifier, the input signal potential supplied by source SSI appears amplified by the factor $(R_1+R_2)/R_2$ at terminal OUT, $R_1$ and $R_2$ being the respective resistances of resistors R1 and R2.

Within operational amplifier OA1, NPN transistors Q1 and Q2 are connected in long-tailed pair configuration, with their respective base electrodes having the terminals $\overline{\text{IN}}$ and IN respectively connected to them, and with their respective emitter electrodes having an interconnection N1 between them from which a tail current $I_T$ is withdrawn by connection to a current source IS1. In a usual design, the quiescent potentials at terminals $\overline{\text{IN}}$ and IN will have zero volt values respective to ground, and Q1 and Q2 will be matched transistors, under which conditions Q1 and Q2 ideally will have quiescent emitter currents each equal to $I_T/2$ in amplitude.

Q1 is connected in a folded-cascode amplifier configuration with PNP transistor Q3, with a current source IS2 supplying a current $I_A$ to an interconnection N2 between the collector electrode of Q1 and the emitter electrode of Q3. $I_A$ is made larger than $I_T/2$ and flows to supply the combined quiescent collector current of Q1 and quiescent emitter current of Q3. Since the quiescent collector current demand of Q1 can be expected to be within a few percent as large in amplitude as its quiescent emitter current of $I_T/2$, the quiescent emitter current of Q3 will be substantially equal to the amount by which $I_A$ exceeds $I_T/2$. In a conventional folded-cascode amplifier, for example as shown in U.S. Pat. No. 3,979,689, the base electrode of Q3 would be biased at a fixed potential between ground and the potential applied by VS1 to terminal B−, preferably close to the latter potential so as not to restrict the range of signal potentials on terminals IN and $\overline{IN}$; this results in the $V_{CE}$ of Q1 being free to vary over almost the full range of potentials between those applied to terminals B+ and B−.

In the FIG. 1 folded-cascode amplifier connection of Q1 and Q3, however, the emitter potential of Q1 is applied directly, without potential offset, to the base electrode of Q3 in accordance with the invention. With this connection the emitter-follower action of Q3 regulates the $V_{CE}$ of Q1 to an amplitude equal to the $V_{BE}$ of Q3. Since the $V_{BE}$'s of all transistors constructed of the same basic semiconductor material are nearly alike, particularly if the densities of current flow through their emitter-base junctions are about the same, the $V_{CE}$ of Q1 is regulated to be substantially equal to its $V_{BE}$, resulting in its collector and base potentials (i.e., its $V_C$ and $V_B$) being nearly equal. This $V_C = V_B$ condition, as pointed out above, virtually eliminates leakage currents across the collector-base junction of Q1 (and greatly reduces Miller capacitance effects). This $V_C = V_B$ condition permits Q1, as shown, to be of super-beta type, if one so desires. (The small rectangular box in place of the vertical line in a conventional transistor symbol indicates a super-beta transistor in the drawing).

Where radiation-hardening of operational amplifier OA1 is a goal, the $V_C = V_B$ condition of Q1 permits an auxiliary semiconductor junction AJ1 having the same profile and area as the collector-base junction Q1 to be connected in inverse-parallel connection with the collector-base junction of Q1, so that each of these junctions experiences the same potential across itself as the other, without either junction exhibiting substantial forward conduction of current. The inverse-parallel connection of junction AJ1 and the collector-base junction of Q1 forms a loop in which the similar-valued transient photo-currents generated in these junctions, responsive to transient ionizing radiation impinging upon them, may flow without entering other portions of the circuitry.

With the galvanic connection between the emitter electrode of Q1 and base electrode of Q3, the transient photo-currents, as generated in the collector-base junction of Q3 responsive to impinging transient ionizing radiation, flow into the base electrode of Q3 from the emitter electrode of Q1, augmenting that portion of the tail current demanded from Q1. The common-base amplifier action of Q1 causes it to place a correspondingly increased collector current demand on IS2, decreasing the emitter current available to Q3. The portion of the collector current of Q3 responsive to this emitter current is thus decreased in measure substantially equal to its augmentation by the transient photocurrent generated in the collector-base junction of Q3. That is, regulation of the $V_{CE}$ of a transistor to facilitate compensation of transient photo-currents generated in its collector-base junction responsive to impinging transient ionizing radiation can be accomplished using folded-cascode amplifiers per the present invention, so as to avoid the problems associated with transient photocurrent generation in conventional $V_{CE}$ regulation circuitry itself.

Q2 is connected in a folded-cascode amplifier configuration with PNP transistor Q4, with a current source IS3 supplying a current $I_B$ to an interconnection N3 between the collector electrode of Q2 and the emitter electrode of Q4. Q4 regulates the $V_{CE}$ of Q2 to create a $V_C = V_B$ condition for Q2, permitting an auxiliary semiconductor junction AJ2 to be connected in inverse-parallel connection with the collector-base junction of Q2 for radiation-hardening purposes. In an operational amplifier it is customary to operate the halves of the differential-input amplifier first stage identically, so $I_B$ will customarily equal $I_A$ as indicated in FIG. 1. The balanced collector current variations of the long-tailed pair transistors Q1 and Q2 will engender similar balanced collector current variations in the common-base amplifier transistors Q3 and Q4, respectively, in such an arrangement.

The remainder of the design of operational amplifier QA1 is conventional. The balanced collector current variations of Q3 and Q4 are constructively combined—i.e., converted to single-ended form—using a current mirror amplifier connection of NPN transistors Q5 and Q6. The single-ended current variations are applied to the base electrode of a grounded-emitter transistor Q7. Q7 is supplied quiescent collector current from a current source IS4 and has a capacitor C1 connected between its collector and base electrodes to provide the dominant roll-off of frequency response in the operational amplifier OA1. These connections of Q7 form the driver stage, developing drive signal at node N4, to which the collector electrode of Q7 connects. This drive signal is applied to the input of an output power amplifier stage PAS, the output of which is connected to terminal OUT. Any of the current sources IS1, IS2, IS3 and IS4 might consist simply of a resistor.

Generally, as known, it is preferable to have current sources of the constant-generator type, which are easily designed for differential connections of folded-cascode amplifiers. IS1 may, for example, comprise an NPN transistor with its emitter electrode connected to B-terminal and with its base electrode biased to generate constant collector current demand at its collector electrode, which is connected to node N1. Similarly, each of current sources IS2, IS3, and IS4 may, for example, comprise a respective PNP transistor with its emitter electrode connected to B+ terminal and with its base electrode biased to generate constant collector current to be supplied at the appropriate point—node N2, N3 or N4—in the operational amplifier OA1. Such arrangements permit the terminals $\overline{IN}$ and IN to swing over potentials ranging from one-and-a-half $V_{BE}$ less negative than the potential on B− terminal to one-half $V_{BE}$ less positive than the potential on B+ terminal.

Figure 2:
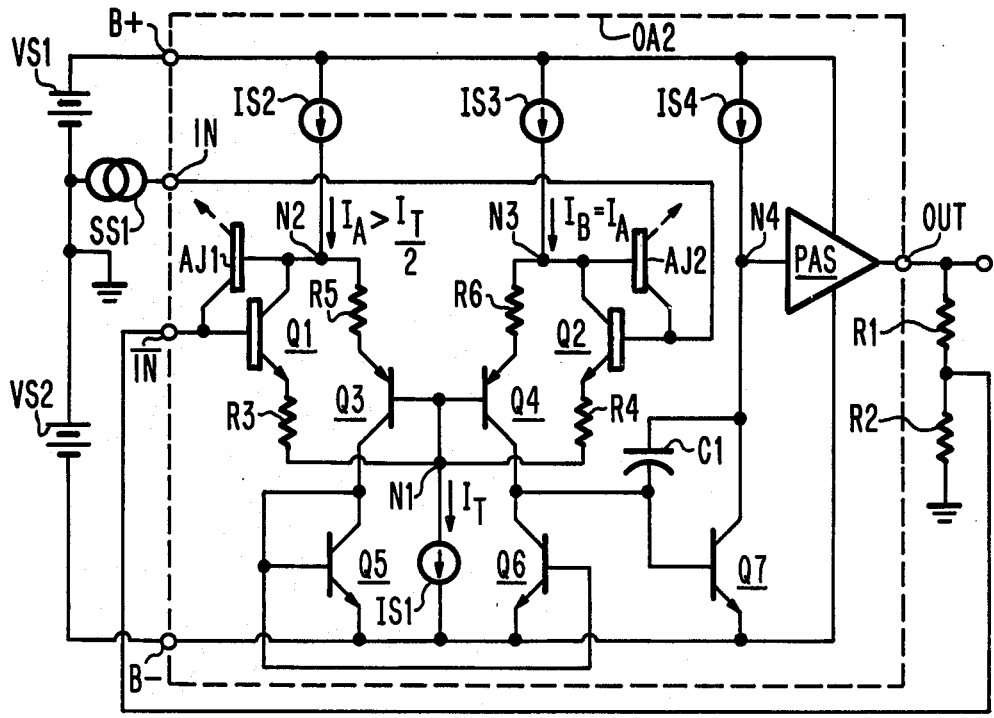

In the FIG. 2 operational amplifier OA2, the long-tailed-pair transistors Q1 and Q2 are connected to node N1 by respective emitter degeneration resistors R3 and R4 having respective resistances $R_3$ and $R_4$. The effect the potential drops across these resistors tend to have upon the regulation of the $V_{CE}$'s of Q1 and Q2 is compensated for by including a resistor R5 between node N2 and the emitter electrode of Q3 and by including a resistor R6 between node N3 and the emitter electrode of Q4, the respective resistances $R_5$ and $R_6$ of R5 and R6 being chosen so the potential drops across them equal those across R3 and R4. This requirement is fulfilled for the following relationships of $R_5$ and $R_6$ to $R_3$ and $R_4$, respectively.

$$R_5 = R_3/[(2I_A/I_T) - 1]$$

$$R_6 = R_4/[(2I_B/I_T) - 1]$$

Compensation is easily accomplished so long at $I_A$ and $I_B$ are held in fixed ratio to $I_T$.

Figure 3:
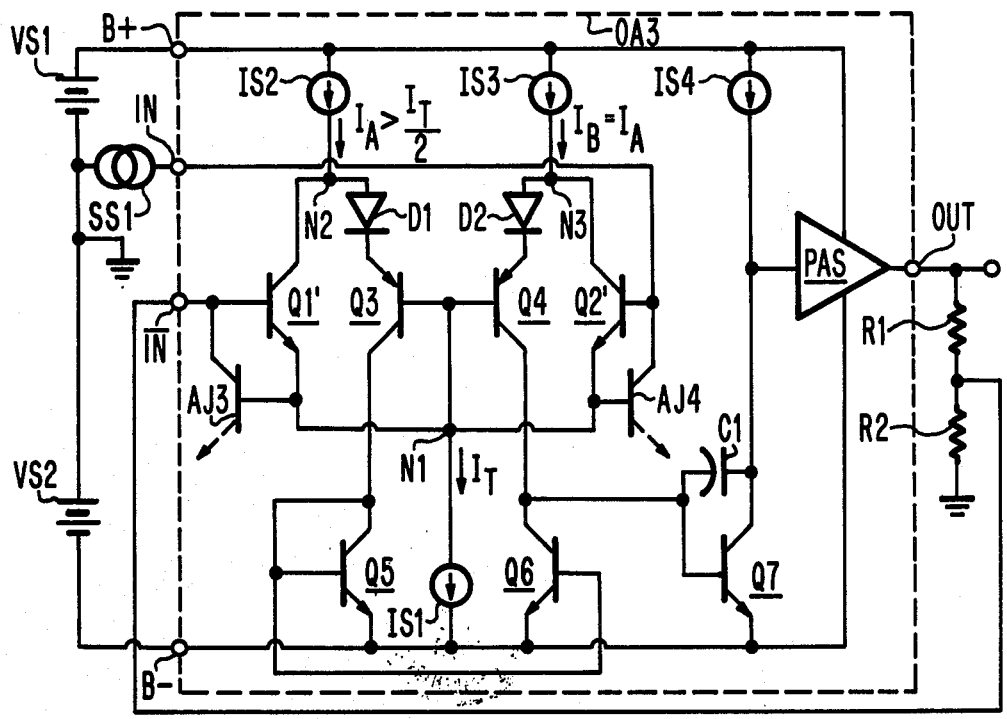

In the radiation-hardened operational amplifier OA3 of FIG. 3, the long-tailed pair transistors Q1' and Q2' are shown as being conventional-process, rather than super-beta, transistors. The transient photo-current generated in the collector-base junction of Q1' is bridged out of its base circuit by an auxiliary semiconductor junction AJ3 connected in inverse-parallel connection with the emitter-base junction of Q1' and so reverse-biased by the $V_{BE}$ offset of the forward-conducting emitter-base junction of Q1'. So that the bridge may balance and transient photo-currents not flow in a cross-arm connection through terminal $\overline{\text{IN}}$, the transient photo-currents generated in AJ3 and in the collector-base junction of Q1' due to impinging transient ionizing radiation must be made the same. To this end, three things are done. Q1' and AJ3 are arranged to be exposed to the same transient ionizing radiation. AJ3 is made to have the same profile and area as the collector-base junction of Q1'. Finally, the $V_{CE}$ of Q1' is regulated to twice its $V_{BE}$ so its collector-base junction like AJ3 is reverse-biased by a $V_{BE}$, which is done by inserting a forward-biased semiconductor diode means D1 (such as an NPN transistor self-biased by collector-to-base connection) between node N2 and the emitter of Q3. Auxiliary semiconductor junction AJ4, Q2', Q4 and forward-biased semiconductor diode means D2 between node N3 and the emitter of Q4 are related-similarly as AJ3, Q1', Q3 and D1 to prevent transient photo-currents from flowing through terminal IN.

Figure 4:
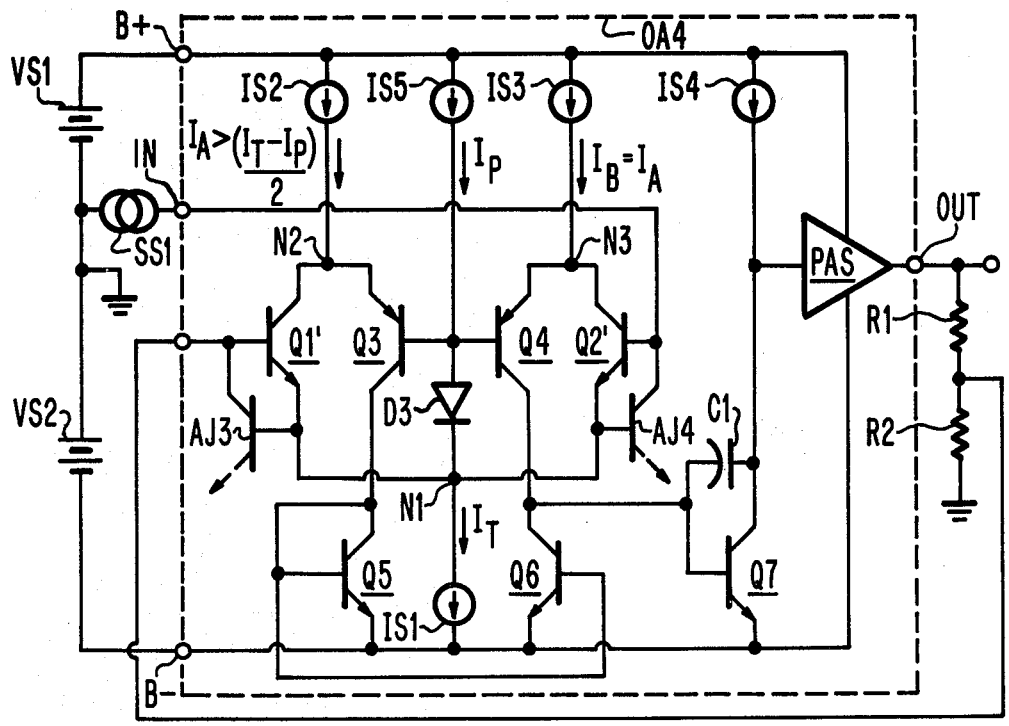

FIG. 4 shows a radiation hardened operational OA4 using auxiliary semiconductor junctions AJ3 and AJ4 in inverse-parallel connection with the emitter-base junctions of long-tailed pair transistors Q1' and Q2' to bridge out transient photo-currents from flowing through terminals IN and $\overline{\text{IN}}$. In contrast to operational amplifier OA3, the emitter electrodes of Q3 and Q4 are connected directly without intervening impedances to nodes N2 and N3, respectively, and node N1 is connected to the base electrodes of Q3 and Q4 by semiconductor diode means D3 forward-biased by current from a current source IS5. D3 may consist of a transistor self-biased by collector-to-base connection, for example. Alternatively, D3 may comprise the emitter-base junction of a PNP emitter-follower transistor. D3 provides the additional $V_{BE}$ offset that augments the $V_{BE}$ offsets of Q3 and Q4 to regulate the $V_{CE}$'s of Q1' and Q2' to $2V_{BE}$.

Armed with the foregoing disclosure one skilled in the art can readily develop other embodiments of the present invention, and the claims are intended to apply to such other embodiments. For example, where balanced-to-single-ended conversion of the output signals of Q3 and Q4 is unnecessary, one may dispense with one of the transistors Q3 and Q4 that does not supply output signal from its collector and with the one of the current sources that supplies it collector current, replacing the current source with a direct connection to B+ terminal. A folded-cascode amplifier which is not connected in differential amplifier configuration with another is possible, also. One may insert resistors R3, R4, R5 and R6 in the operational amplifier OA3 or OA4 in a manner corresponding to their insertion in operational amplifier OA1 to form operational amplifier OA2.

What is claimed is:

1. A folded-cascode amplifier comprising:

first and second transistors respectively of first and second complementary conductivity types, each of said first and second transistors having respective base and emitter and collector electrodes and having collector-base and emitter-base junctions;

means for applying a substantially unidirectional current with input signal variations between the emitter and base electrodes of said first transistor, responsive to which the emitter potential of said first transistor is subject to change respective to the potential at a point of fixed reference potential;

first current source means for supplying the combined quiescent collector current of said first transistor and quiescent emitter current of said second transistor to a node to which the collector electrode of said first transistor and the emitter electrode of said second transistor each connect;

means applying the emitter potential of said first transistor to the base electrode of said second transistor for causing the base potential of said second transistor to follow the emitter potential of said first transistor;

load means having a direct current conductive path therethrough connecting the collector electrode of said second transistor to said point of fixed reference potential; and a first semiconductor junction having the same profile and area as the collector-base junction of said first transistor arranged to be exposed to similar transient ionizing radiation as the collector-base junction, connected in inverse-parallel connection with one of the collector-base and emitter-base junctions of said first transistor for keeping a substantial portion of any leakage current flowing through the collector-base junction of said first transistor responsive to transient ionizing radiation from flowing as base current of said first transistor.

2. A folded cascode-amplifier as set forth in claim 1 wherein said means for applying a substantially unidirectional current with signal variations between the emitter and base electrodes of said first transistor includes:

a third transistor of said first conductivity type, having base and emitter and collector electrodes; and means connecting said first and third transistors in long-tailed-pair configuration including, means for applying input signal potential variations between the base electrodes of said first and third transistors, means for applying a common-mode potential to the base electrodes of both said first and said third transistors, and second current source means for supplying a tail current connected to an interconnection between the emitter electrodes of said first and third transistors.

3. A folded-cascode amplifier as set forth in claim 1 wherein said first semiconductor junction is connected in inverse-parallel with the collector-base junction of said first transistor and wherein said means applying the emitter potential of said first transistor to the base electrode of said second transistor is a first direct connection without substantial intervening impedance between the emitter electrode of said first transistor and the base electrode of said second transistor; wherein a second direct connection without substantial intervening impedance connects the collector electrode of said first transistor to said node; and wherein a third direct connection without substantial intervening impedance connects the emitter electrode of said second transistor to said node, the emitter-follower action of said second transistor thereby regulating the emitter-to-collector potential of said first transistor substantially to equal the emitter-to-base potential of said second transistor.

4. A folded-cascode amplifier as set forth in claim 3 wherein said first transistor is a super-beta type.

5. A folded cascode amplifier as set forth in claim 1 wherein said first semiconductor junction is connected in inverse-parallel with the emitter-base junction of said first transistor and wherein said means applying the emitter potential of said first transistor to the base electrode of said second transistor comprises a second semiconductor junction and means connecting said second semiconductor junction between the emitter electrode of said first transistor and the base electrode of said second transistor for regulating the emitter-to-collector potential of said first transistor to a value substantially twice as large as its emitter-to-base potential.

6. A folded cascode amplifier as set forth in claim 1 wherein said first semiconductor junction is connected in inverse-parallel with the emitter-base junction of said first transistor and wherein a second semiconductor junction is connected between said node and the emitter electrode of said second transistor and is poled for forward conduction of the emitter current of said second transistor, for regulating the emitter-to-collector potential of said first transistor to a value substantially twice as large as its emitter-to-base potential.

7. A radiation-hardened circuit including:

a first transistor having emitter and base and collector electrodes, having a collector-base junction which generates a transient photo-current responsive to any transient ionizing radiation impingent thereupon, and having an emitter-base junction;

a collector load means having a direct current path therethrough connecting the collector electrode of said first transistor and a point of operating potential;

means for applying forward-bias to the emitter-base junction of said first transistor, which means comprises first and second current sources respectively connected to the base electrode of said first transistor and to its emitter electrode and an amplifier having an input terminal to which the base electrode of said first transistor connects and having an output terminal connected to the emitter electrode of said first transistor, said amplifier responsive to said photocurrent flowing to its input terminal to supply a current of substantially corresponding value at its output terminal, decreasing the current available from said second current source to the emitter electrode of said first transistor, lessening the collector current flowing in said first transistor responsive to its emitter current thereby to compensate for the increase in its collector current due to said photocurrent.

8. A radiation-hardened circuit as set forth in claim 7 wherein said amplifier comprises:

a second transistor of a conductivity type complementary to that of said first transistor having an emitter electrode connected to the base electrode of said first transistor, having a base to which a biasing potential is applied, having a collector electrode connected to the emitter electrode of said first transistor, and having a collector-base junction; and an auxiliary semiconductor junction similar in profile and area to the collector-base junction of said second transistor with which it is in inverse-parallel connection, said auxiliary semiconductor junction being arranged to be subject to the same transient ionizing radiation as the collector-base junction of said second transistor.

* * * * *